United States Patent [19]

Sanchez

[11] Patent Number: 5,035,531
[45] Date of Patent: Jul. 30, 1991

[54] UTILITY CUT PATCH IDENTIFICATION TAG

[76] Inventor: Richard E. Sanchez, 409 Forsyth Pl., Claremont, Calif. 91711

[21] Appl. No.: 324,567

[22] Filed: Mar. 16, 1989

Related U.S. Application Data

[63] Continuation-in-part of Ser. No. 67,935, Jun. 29, 1987, Pat. No. 4,888,896.

[51] Int. Cl.$^5$ ............................. E01F 9/06; E01F 9/08
[52] U.S. Cl. ............................................ 404/12; 404/9
[58] Field of Search ..................... 404/9, 12, 14–16, 404/73, 93

[56] References Cited

U.S. PATENT DOCUMENTS

| | | | |
|---|---|---|---|
| 1,624,000 | 4/1927 | Parkhurst | 404/10 |
| 1,661,870 | 3/1928 | Baldwin | 404/9 |
| 1,678,215 | 7/1928 | Greene | 404/13 |
| 1,703,227 | 2/1929 | Dickgiesser | 404/9 |
| 1,728,275 | 9/1929 | Herman et al. | 404/12 |
| 1,804,389 | 5/1931 | Ellis | 404/9 |
| 1,918,336 | 7/1933 | Horni | 404/15 |
| 2,093,583 | 9/1937 | Upton | 40/630 |
| 2,098,478 | 11/1937 | Young | 40/630 |
| 2,098,557 | 11/1937 | Thomas | 40/630 |
| 2,127,233 | 8/1938 | Older | 404/12 |
| 2,129,503 | 9/1938 | Mulieri | 404/6 |
| 2,232,023 | 2/1941 | Flocks | 404/14 |
| 3,512,600 | 5/1970 | Surine et al. | 404/14 |
| 3,556,637 | 1/1971 | Palmquist | 404/16 X |
| 3,587,415 | 6/1971 | Eigenmann et al. | 404/9 |
| 3,908,055 | 9/1975 | Susuki et al. | 404/12 |
| 4,127,346 | 11/1978 | Bouffard | 404/15 |

FOREIGN PATENT DOCUMENTS

| | | | |
|---|---|---|---|
| 6324 | 2/1932 | Australia . | |
| 216182 | 5/1924 | United Kingdom | 404/12 |

Primary Examiner—Ramon S. Britts
Assistant Examiner—Gay Ann Spahn
Attorney, Agent, or Firm—Christie, Parker & Hale

[57] ABSTRACT

A utility cut patch identification tag comprises a plate of durable material having at least two barbed legs extending from it slower surface, and a labeling indicia on its upper surface. The tag is preferably circular with a diameter of from about one to about two inches. The tag is pressed into the surface of fresh paving material which has been introduced into a previously cut out section of pavement.

20 Claims, 2 Drawing Sheets

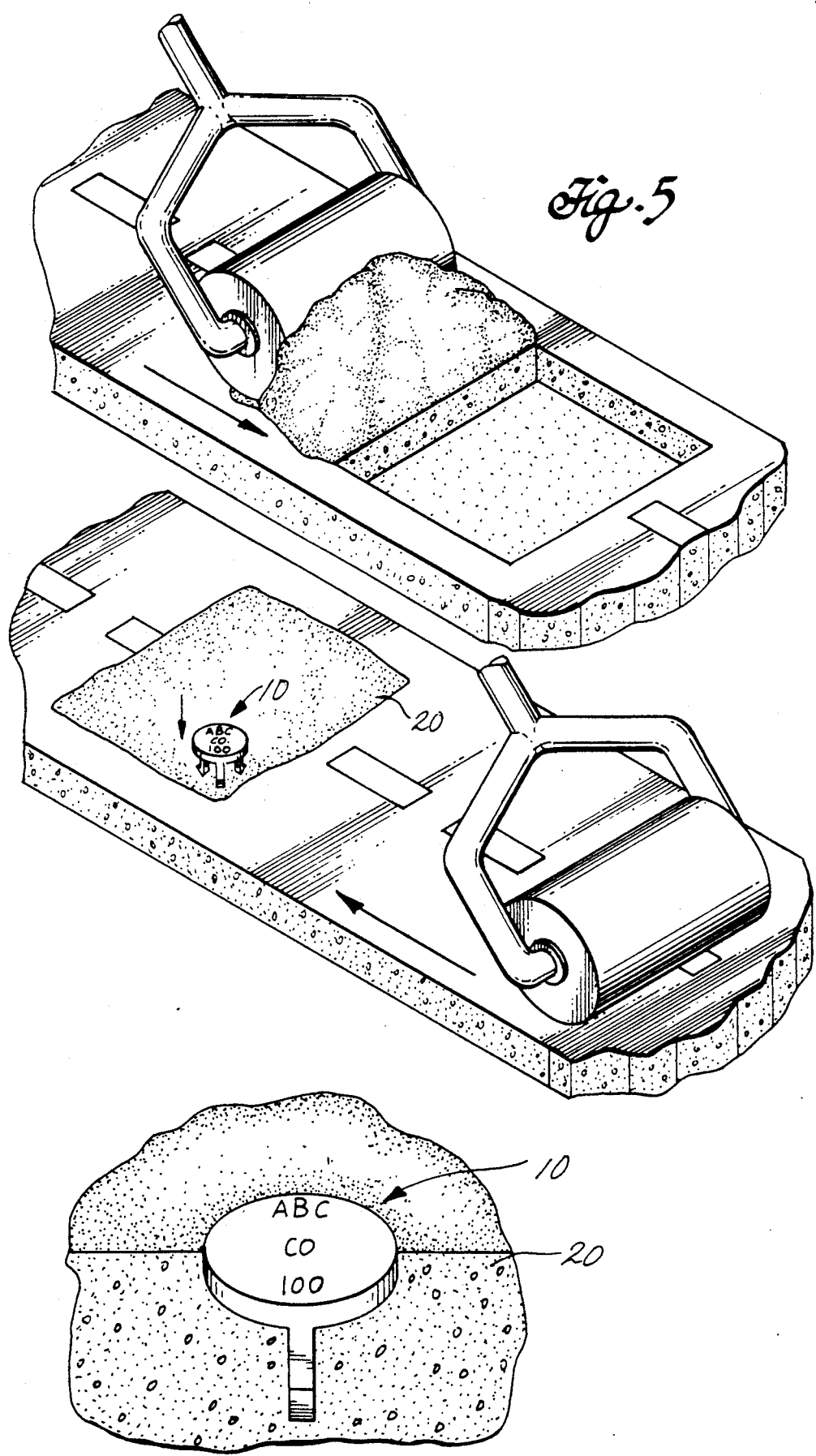

UTILITY CUT PATCH IDENTIFICATION TAG

CROSS-REFERENCE TO RELATED APPLICATIONS

This is a Continuation-in-Part to the patent application entitled UTILITY CUT PATCH IDENTIFICATION TAG, Ser. No. 07/067,935, filed June 29, 1987, now U.S. Pat. No. 4,888,896 and incorporated by reference herein.

FIELD OF THE INVENTION

This invention relates to utility cut patches and more particularly to an identification tag for utility cut patches.

BACKGROUND OF THE INVENTION

To perform repairs on utility equipment located beneath streets or other paved surfaces, or to install new equipment beneath streets or other paved surfaces, utility companies typically cut and remove a section of the overlying pavement material, i.e., asphalt or concrete, thus leaving a hole in the pavement. After the installation or repair has been completed, the paved surface is repaired by filling the hole with new paving material. The repaired sections are generally referred to as utility cut patches.

Government regulations generally require paving companies to label utility cut patches that they have installed. Current markers consist of a metal washer which is secured to the surface of the utility cut patch by means of a nail which extends through the washer and into the paving material. These nails and washers have been mistaken for survey tags. This has led to improper laying of building foundations.

Furthermore, it is not uncommon for the nail to work its way loose within a short time. This occurs due to contraction and expansion of the paving material. This may also occur due to repeated striking of the washer and nail by cars and pedestrians which occurs because the washer and nail typically protrude above the surface of the cut patch.

Once it has worked loose, the nail and washer may be dislodged from the utility cut patch. This eliminates a primary record of the company that has installed the cut patch. This also results in a loose nail on the surface of a roadway, which could puncture an automobile tire or otherwise injure members of the public.

In addition, the nails often extend deeply into the paving material. When the nails loosen, and particularly when they are dislodged, moisture easily penetrates the cut patch through the nail hole. Such water seepage may cause rust or have some other detrimental effect on the underlying equipment.

SUMMARY OF THE INVENTION

Given the prior experience with nails extending into the paving material, it was originally thought that an identification tag should not have any component extending into the paving material. Therefore, the flat tag of application Ser. No. 07/067,935 filed June 29, 1987 was developed. While this flat tag worked very well, it was unexpectedly discovered that further improvement over even this excellent tag design could be achieved by providing barbed legs that extend into the paving material a sufficient distance for the legs to be completely surrounded by the paving material matrix and yet not so far as to penetrate the paving material.

Accordingly, the present invention provides a utility cut patch identifying tag comprising a small, generally flat plate of a durable material having at least two, and preferably three, barbed legs extending from the lower surface of the plate. On the top surface of the tag, there is provided indicia indicating, for example, the identity of the paving company that has installed the cut patch on which the tag is applied.

The plate is preferably circular and preferably has a diameter of from about 1 to about 2 inches. The thickness of the plate is preferably less than about ¼ inch and more preferably is about ⅛ inch.

The present invention further comprises a method for repairing and identifying a cut out section of a paved surface. The method comprises filling the cut out section with a paving material so that the upper surface of the paving material is generally coplanar with the surrounding paving material. The process further comprises applying an identifying tag as described above to the paving material before the material dries or cures. The tag is pressed into the paving material so that the barbed legs of the tag are fully embedded within the surface of the paving material, and the plate is at least partially embedded within the surface of the paving material.

BRIEF DESCRIPTION OF THE DRAWINGS

These and other features and advantages of the present invention will be better understood by reference to the following detailed description when considered in conjunction with the accompanying drawings, wherein:

FIG. 5 is a series of pictorial schematic views of a method for installing a utility cut patch identifying tag.

DETAILED DESCRIPTION

Figure 1:
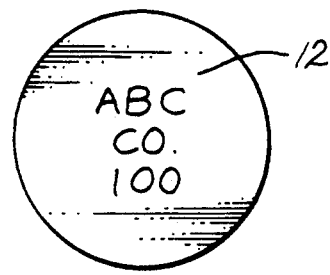
FIG. 1 is a top view of a preferred utility cut patch identification tag.
Figure 2:
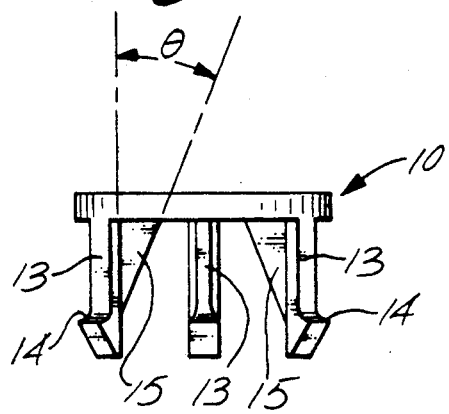
FIG. 2 is a side view of the identification tag of FIG. 1.

A preferred utility cut patch identification tag is shown in FIGS. 1 and 2. The identification tag 10 comprises a durable plate 11 having upper and lower surfaces. On the upper surface of the plate 11, there is provided indicia 12 indicating, for example, the name of the company that installed the cut patch to which the tag is applied, the type of equipment underlying the cut patch to which the tag is applied, or the like.

Extending from the lower surface of the plate 11 are legs 13, each having a barb 14 at their distal end. At least two legs are provided, preferentially situated near or at the perimeter of the plate. Tags with multiple legs are contemplated; three legs are preferred. In a preferred embodiment, the three legs are disposed about 120° apart from one another.

Preferably, each leg 13 is integrally attached to the plate 11. Gussets 15, preferably integral with each leg and the plate, further support each leg. In a preferred embodiment each gusset is wedge-shaped and meets a leg 13 at an angle of about 30°.

The tag may be made of any suitable, durable material, such as metal, plastic, or mixtures thereof. A preferred material is polypropylene. If polymeric materials are used, they may further comprise a variety of fillers as desired. Preferred fillers include pigments which impart color to the plate, and glass beads or the like which impart reflectivity to the plate. Color and reflectivity are desired to make the tags easily located during the day and night.

The indicia 13 may be in any suitable form. For example, the indicia 13 may comprise markings coated onto the wafer 11 with a suitable material such as ink or paint. Alternatively, the indicia 13 may comprise markings engraved into the wafer 11 or comprise raised markings such as raised letters or the like. The indicia may even by provided by using a wafer with a distinctive outline or shape.

Figure 3:
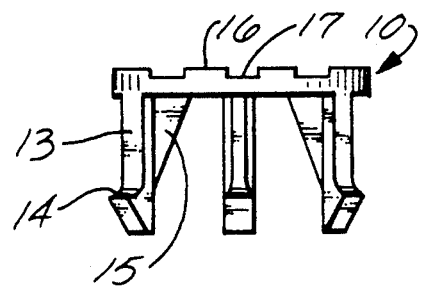
FIG. 3 is a side view of an alternate embodiment of a utility cut patch identification tag.

The upper surface of the plate may be smooth as shown in FIGS. 1 and 2, or irregular, as shown in FIG. 3 wherein the plate comprises alternating plateaus 16 and valleys 17.

If the plate comprises a reflectivity imparting filler, it is preferred that the upper surface of the plate have raised sections or is otherwise irregular. Such surfaces tend to enhance reflectivity of the tag.

In the embodiments shown, the plate is generally circular in shape and has a preferred diameter of about 1.5 inches. A circular shape is presently preferred because it resists removal better than tags having sharper corners. It is understood, however, that other shapes such as squares, triangles, diamonds, or the like may be used if desired. Other shapes may be desirable for providing indicia 12.

The size of the plate is not critical. It is presently preferred that the area of the plate be less than about 5 square inches and preferably from about 1 to about 3 square inches. For example, circular tags having a diameter of from about 1 to about 2 inches are presently preferred.

Like the diameter of the plate 11, the thickness of the plate is not critical. The minimum thickness is generally that which imparts sufficient physical integrity and durability to the tag 10 to withstand environmental forces to which the tag is subjected during use for a reasonable time, e.g. at least one year, without destruction. It is preferred that the thickness of the plate not exceed that which enables the tag 10 to be easily pressed into the paving surface so that the top of the plate is flush with the surface of the paving material. If the paving material is asphalt or concrete, a thickness of no more than about 0.125 inch is preferred. If the paving material is mortar, cement or the like, a greater thickness, e.g. 0.25 inch, may be used.

The length of the legs 13 is also not critical, but it is desired that the legs not extend too deeply into the paving material to which the tag is applied so as not to penetrate the pavement material. Therefore, it is preferred that each leg 13 have a length of no more than about 0.75 inch. The legs should, however, have a length sufficient to ensure that the barbs are firmly embedded in the pavement material. In such an embodiment, the lateral width of each leg is preferably about 0.15 inch. The barb 14 extending from each leg preferably protrudes outwardly about 0.06 inch.

The present invention also provides a method for installing an identification tag as described above in the surface of freshly laid paving material. More particularly, in repairing a cut out section of pavement such as asphalt, fresh paving material, i.e., asphalt, is introduced into the cut out section. A roller is passed over the freshly applied material so that the surface of the fresh paving material is generally flush or coplanar with the surface of the surrounding paving material. Before the freshly applied paving material hardens, the identification tag 10 is pressed downwardly into the freshly applied paving material 20 so that the legs 13 are fully embedded within the paving material 20 and the plate 11 is at least partially embedded within the surface or the paving material.

Figure 4:
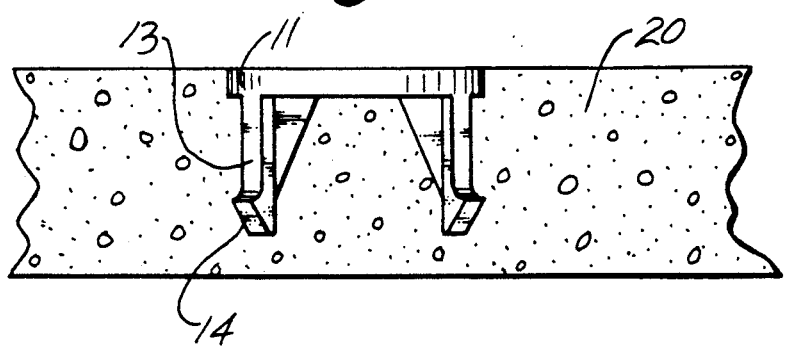
FIG. 4 is a side cross-sectional view of an identification tag embedded in freshly laid paving material.

The barbs 14 ensure that the identification tag 10 stays in place once installed. More specifically, the barbed legs are completely surrounded by the paving material matrix. When an upwardly directed displacing force is applied to the plate 11, the barb 14 on each leg engages the matrix, and resists upward movement. An installed tag is shown in FIG. 4.

Preferably, the upper surface of the tag 10 is flush with the top surface of the paving material so that the environmental forces to which the tag will be subjected, such as those exerted by vehicular traffic, are minimized. This is preferably accomplished by applying the tag 10 to the surface of the paving material 20 prior to final rolling. Final rolling then presses the tag 10 into the paving material 20.

From the foregoing description, it is apparent that many variations and modifications of the above-described structures and procedures may be practiced without meaningfully departing from the scope of the invention. Accordingly, the foregoing description should not be read as pertaining only to the precise structures and procedures described, but rather should be read consistent with and as support for the following claims for the fullest and fairest scope.

What is claimed is:

1. A utility cut patch identifying tag comprising:
   a generally flat plate of a durable material having upper and lower surfaces;
   at least two barbed legs extending from the lower surface of the plate;
   a plurality of gussets, each gusset being integral with a leg and the lower surface of the plate; and
   at least one labeling indicia on the upper surface of the plate;
   wherein the tag is capable of being embedded into fresh paving material.

2. A utility cut patch identifying tag as claimed in claim 1, having three barbed legs extending from the lower surface of the plate.

3. A utility cut patch identifying tag as claimed in claim 1, wherein the said at least two legs are situated near the perimeter of the plate.

4. A utility cut patch identifying tag as claimed in claim 1, wherein the plate is generally circular.

5. A utility cut patch identifying tag as claimed in claim 4, wherein the plate has a diameter of from about one to about two inches.

6. A utility cut patch identifying tag as claimed in claim 1, wherein the plate has a thickness of about $\frac{1}{8}$ inch.

7. A utility cut patch identifying tag as claimed in claim 1, wherein the durable material comprises at least one colored pigment.

8. A utility cut patch identifying tag as claimed in claim 1, wherein the durable material comprises at least one filler for imparting reflectivity to at least the upper surface of the plate.

9. A utility cut patch identifying tag as claimed in claim 8, wherein the upper surface of the plate comprises at least one raised section.

10. A utility cut patch identifying tag as claimed in 1, wherein the said at least two legs are integral with the plate.

11. A utility cut patch identifying tag as claimed in claim 1, wherein the tag has a top surface area of no more than about five square inches.

12. A utility cut patch identifying tag having a top surface area of no more than about five square inches comprising:
   a generally flat circular plate of a durable material and having upper and lower surfaces;
   three barbed legs, integral with and extending from the lower surface of the plate, each leg having a gusset integral therewith; and
   at least one labeling indicia on the upper surface of the plate;
   wherein the tag is capable of being imbedded into fresh paving material.

13. A utility cut patch identifying tag as claimed in claim 1, wherein the durable material comprises polypropylene.

14. A method for repairing and identifying a cut out section of pavement comprising;
   filling the cut out section of the pavement with a fresh paving material;
   smoothing the fresh paving material so that the surface of the fresh paving material is generally flush with the surface of the surrounding pavement;
   applying an identifying tag to the surface of the paving material, said identifying tag comprising a generally flat plate of a durable material with upper and lower surfaces, at least two barbed legs extending from the lower surface of the plate, a plurality of gussets, each gusset being integral with a leg and the lower surface of the plate, and at least one labeling indicia on the upper surface of the plate; and
   pressing the identifying tag into the paving material so that the legs are fully embedded within the paving material and the plate is at least partially embedded within the surface of the paving material.

15. A method as claimed in claim 14 wherein the plate is generally circular.

16. A method as claimed in claim 15 wherein the diameter of the plate is form about 1 to about 2 inches.

17. A method as claimed in claim 14 wherein the paving material is asphalt and the thickness of the plate is about ⅛ inch.

18. A method as claimed in claim 14 wherein the durable material comprises at least one colored pigment.

19. A method as claimed in claim 14 wherein the durable material comprises at least one filler for imparting reflectivity to at least the upper surface of the plate.

20. A method as claimed in claim 19 wherein the upper surface of the plate comprises at least one raised section.

* * * * *